(12) United States Patent
Lu

(10) Patent No.: US 6,864,728 B1
(45) Date of Patent: Mar. 8, 2005

(54) FREQUENCY MULTIPLIER AND AMPLIFICATION CIRCUIT

(75) Inventor: Jinghui Lu, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/377,948

(22) Filed: Feb. 28, 2003

(51) Int. Cl.[7] .......................................... H03B 19/00
(52) U.S. Cl. ...................................... 327/122; 327/113
(58) Field of Search ................................ 327/113, 116, 327/119, 122, 355–359

(56) References Cited

U.S. PATENT DOCUMENTS

| | | | | |
|---|---|---|---|---|
| 3,974,460 A | * | 8/1976 | Hongu et al. ................... | 331/76 |
| 4,712,073 A | * | 12/1987 | Van Rumpt et al. ......... | 327/355 |
| 5,699,068 A | * | 12/1997 | Cirineo ......................... | 342/197 |
| 6,100,731 A | * | 8/2000 | Otaka ........................... | 327/119 |
| 6,535,037 B2 | * | 3/2003 | Maligeorgos ................ | 327/116 |
| 6,538,499 B1 | * | 3/2003 | Lu ................................ | 327/557 |
| 6,553,216 B1 | * | 4/2003 | Pugel et al. .................. | 455/340 |
| 6,664,824 B2 | * | 12/2003 | Laws ............................ | 327/122 |

* cited by examiner

Primary Examiner—Dinh T. Le
(74) Attorney, Agent, or Firm—Timothy W. Markison

(57) ABSTRACT

A frequency multiplier and amplification circuit are disclosed. One embodiment of the present invention comprises: a multiplier operably coupled to multiply a first sinusoidal waveform having a first frequency with a second sinusoidal waveform having a second frequency to produce a third sinusoidal waveform, having a frequency representative of a difference between the first frequency and the second frequency, and a fourth sinusoidal waveform having a frequency representative of a sum of the first and second frequencies; and a frequency-tuned load operably coupled to substantially attenuate the third sinusoidal waveform and to substantially pass the fourth sinusoidal waveform as an output of the frequency-tuned multiplier circuit. The frequency-tuned multiplier circuit can be a single-ended multiplier circuit or a differential multiplier circuit with corresponding single-ended or differential first and second sinusoidal waveforms.

23 Claims, 4 Drawing Sheets

PLL circuit 10
(Prior Art)

integrated circuit 300

US 6,864,728 B1

FREQUENCY MULTIPLIER AND AMPLIFICATION CIRCUIT

TECHNICAL FIELD OF THE INVENTION

This invention relates generally to integrated circuits and, more particularly, to a frequency multiplier for use in such integrated circuits. Even more particularly, the present invention relates to a frequency multiplier and amplification circuit that is not based on a phase-locked loop.

BACKGROUND OF THE INVENTION

Phase-locked loop ("PLL") circuits are well known in the art and are often used for frequency multiplication. As shown in FIG. 1, the main components of a PLL circuit 10 for multiplying a reference signal 12's frequency by N comprise a phase comparator 14, a low-pass filter 16, a voltage control oscillator ("VCO") 18 and an N frequency divider module 20. The N frequency divider module 20 provides feedback control to provide a correct frequency comparison with the reference signal 12 in the phase comparator 14. The N frequency divider module 20 supplies the phase comparator 14 with a feedback signal obtained by N-dividing an output signal 22 from the VCO 18. The phase comparator 14 provides an error signal to the low-pass filter 16 corresponding to a phase difference between the reference signal 12 and the rising (or falling) edge of the feedback signal from the N frequency divider module 20. The low-pass filter 16 extracts only the DC components from the error signal output from the phase comparator 14 and generates a control voltage 24 for controlling the oscillation frequency of the VCO 18. The VCO generates the output signal 22, whose frequency is N times as high as that of the reference signal 12.

While the PLL design of FIG. 1 offers flexibility for frequency multiplication, it does suffer from some significant disadvantages. One disadvantage of the prior art design is that the VCO operating frequency can become very high (depending on the value of N required), resulting in increased power consumption for the multiplier circuit. Further, a VCO circuit is a complex analog device, requiring techniques for reducing power noise and frequency jitter, a common problem with PLL designs. Applications requiring very high frequencies might also use a prior art PLL circuit for frequency multiplication, but in order to increase the frequencies beyond the range of a single PLL circuit, a second PLL circuit may be required. This solution involves not only the problems described above for PLL circuits in general, but also the increased cost associated with the additional circuit real estate needed for the additional PLL circuit. The use of multiple PLL circuits is thus not a desired solution because of cost and complexity.

Prior art frequency multiplier circuits must perform a 90 degree phase shift to create a 90 degree phase signal from the reference signal prior to performing the frequency multiplication. This is because in order to double the frequency of a reference signal, a Sine/Cosine signal pair for the frequency of interest must first be generated (hence the 90 degree phase shift). If the sinusoidal reference signal has a frequency $\theta$, the sine of $\theta$ can be determined simply from the original signal. However, when the frequency of the reference signal is doubled, the sine of $2*\theta$ is given by: $\sin(2\theta) = 2*\sin(\theta)*\cos(\theta)$. Thus, to multiply the reference signal frequency (e.g., to double the reference signal frequency), a 90 degree phase shift signal must first be generated. The reference differential signal cannot be used directly to perform the frequency multiplication. As a result, prior art frequency multiplication circuits are complex and costly, and require additional techniques for reducing power noise and frequency jitter. Thus, a circuit for frequency multiplication without the use of a PLL is desirable.

Therefore, a need exists for a frequency multiplier and amplification circuit that can reduce or eliminate these problems and others associated with prior art frequency multiplier circuits.

BRIEF SUMMARY OF THE INVENTION

The embodiments of the frequency multiplier and amplification circuit of the present invention substantially meet these needs and others. One embodiment of the present invention is a frequency multiplier circuit comprising: a multiplier operably coupled to multiply a first sinusoidal waveform having a first frequency with a second sinusoidal waveform having a second frequency to produce a third sinusoidal waveform, having a frequency representative of a difference between the first frequency and the second frequency, and a fourth sinusoidal waveform having a frequency representative of a sum of the first and second frequencies; and a frequency tuned load operably coupled to substantially attenuate the third sinusoidal waveform and to substantially pass the fourth sinusoidal waveform as an output of the frequency multiplier circuit.

The frequency multiplier circuit of the embodiments of this invention can be a single-ended multiplier circuit or a differential multiplier circuit with corresponding single-ended or differential first and second sinusoidal waveforms.

The frequency-tuned load can further comprise an inductor operably coupled to substantially attenuate the third sinusoidal waveform. Alternatively, the frequency tuned load can comprise an inductor and a capacitor, wherein the inductor is operably coupled to substantially attenuate the third sinusoidal waveform and the capacitor forms a tank frequency tuned to resonate at a frequency approximately equal to the frequency corresponding to the sum of the first and second frequencies. The frequency-tuned load can further form a bandpass filter operably coupled to substantially pass the fourth sinusoidal waveform and to substantially attenuate the third sinusoidal waveform. The frequency-tuned load can also include a tunable varactor. The frequency-tuned load can thus operate to eliminate the difference between the first and second frequencies and pass the sum of the first and second frequencies as the output of the frequency multiplier circuit, effectively removing phase differences between the frequencies being multiplied.

The embodiments of the frequency multiplier circuit of this invention can further include a negative feedback circuit operably coupled to increase the Q of the frequency-tuned load. Further, the first and the second frequencies can be substantially equal or can be different. For example, the second frequency can differ from the first frequency by a frequency offset or by a phase offset resulting from the waveforms' passage through the circuit. Embodiments of the frequency multiplier circuit can further include an output driver circuit comprising a switchable bandpass filtering amplifier. The switchable bandpass filtering amplifier can be a negative feedback inductor bandpass filter amplifier. Embodiments of the present invention can comprise an integrated circuit including a functional circuit block and a clock module, wherein the clock module includes a clock source and a clock multiplier circuit.

DETAILED DESCRIPTION OF THE INVENTION

In general, the embodiments of the present invention provide a low jitter frequency multiplier without the need for a PLL circuit. Such a frequency doubler has wide applications in communications systems. The embodiments of this invention provide an integrated circuit with the ability to directly use the same differential signal to perform frequency multiplication. The present invention further provides the ability to drive a large load with the addition of a switchable bandpass filtering boosting amplifier at the output of the frequency multiplier circuit.

Unlike the prior art, the embodiments of this invention base their operation on using the same reference signal to perform frequency multiplication, thus eliminating the required 90 degree phase shift of the prior art. The present invention accomplishes this by using the equivalence:

$$Cos(2\theta) = 1 - 2(Sin\ \theta)^2 \quad \text{Equation 1}$$

Rearranging Equation 1 yields:

$$Sin(\theta)*Sin(\theta) = (1 - Cos(2*\theta))/2 \quad \text{Equation 2}$$

Based on Equation 2, the embodiments of this invention use two signals of identical frequency, and a fixed phase offset, to generate a multiplied clock signal (e.g., a doubled frequency signal). For example, the present invention can multiply two five gigahertz signals to yield an output at ten gigahertz. The embodiments of this invention can be implemented using CMOS technology. Using two identical frequency signals with a fixed phase offset in Equation 2 yields:

$$Sin(\theta)*Sin(\theta+\Delta) = [Cos(\Delta) - Cos(2*\theta+\Delta)]/2 \quad \text{Equation 3}$$

However, for a fixed phase difference $\Delta$, $Cos(\Delta)$ is a constant. Therefore, $Cos(\Delta)$ can be replaced with a constant value represented by "C". Thus:

$$Sin(\theta)*Sin(\theta+\Delta) = [C - Cos(2*\theta+\Delta)]/2 \quad \text{Equation 4}$$

Therefore, when implemented together with a filter to remove the DC term "C", the embodiments of the present invention provide a frequency multiplier that can multiply the frequency of an incoming signal using the incoming signal directly with an added, fixed, phase delay. The present invention thus eliminates the prior art requirement of generating a 90 degree phase shifted signal prior to frequency multiplication.

Figure 1:
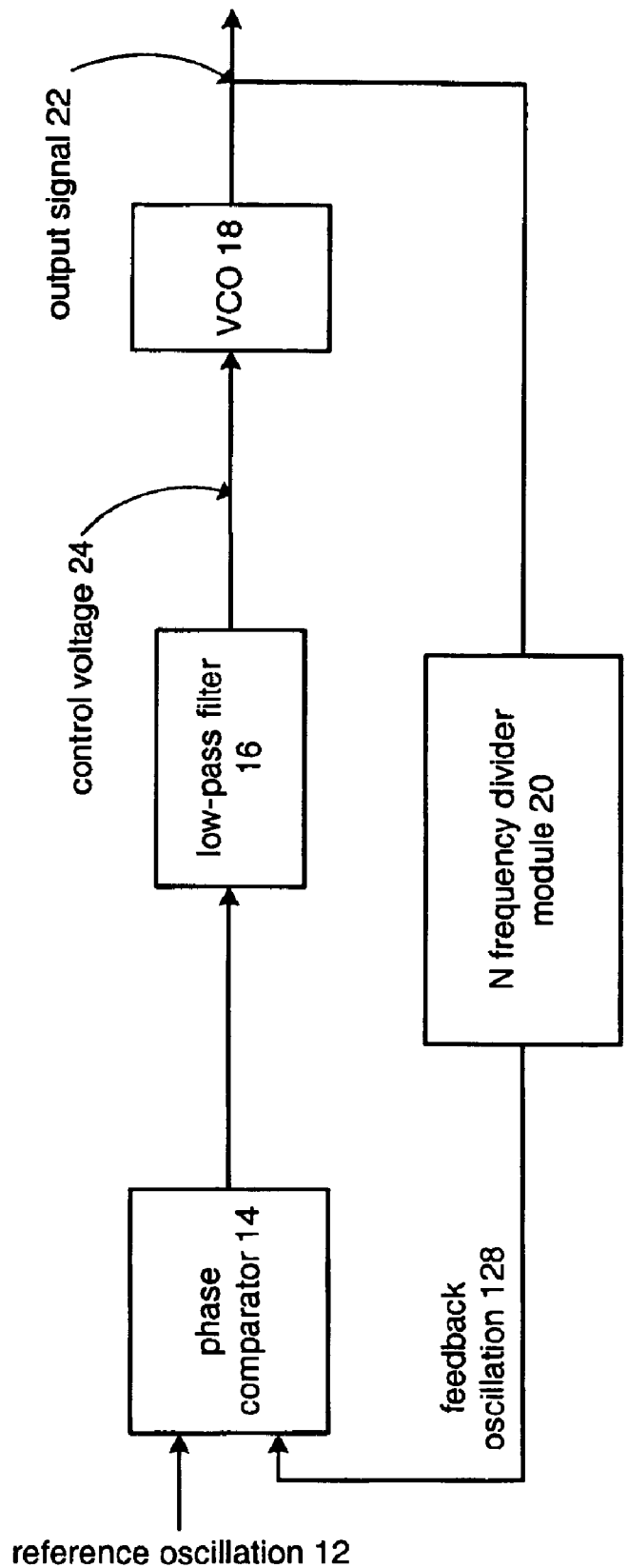
FIG. 1 is a general block diagram of a prior art phase locked loop circuit.
Figure 2:
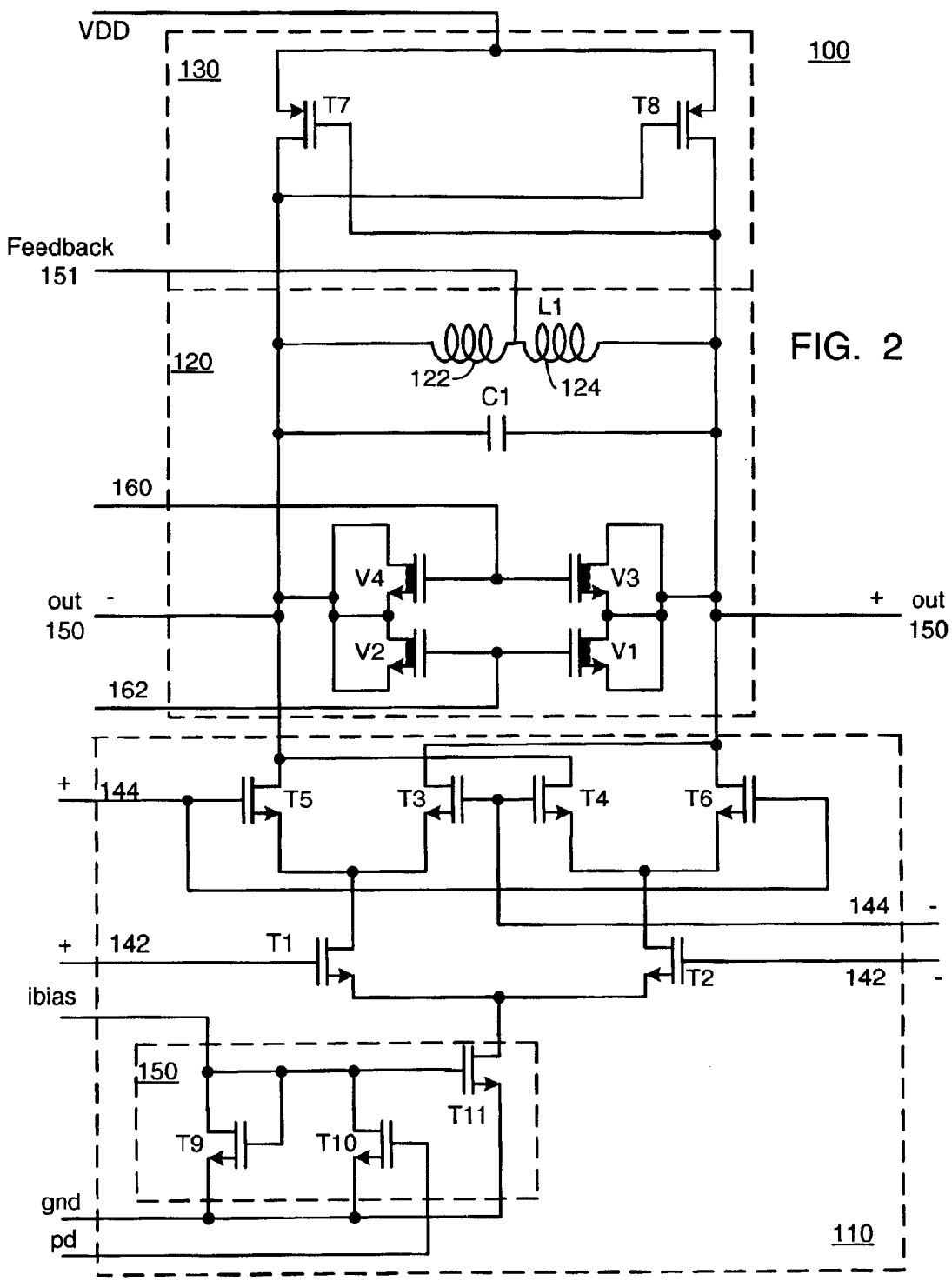
FIG. 2 is a schematic block diagram of an embodiment of a frequency multiplication and amplification circuit 100 in accordance with the present invention.
Figure 3:
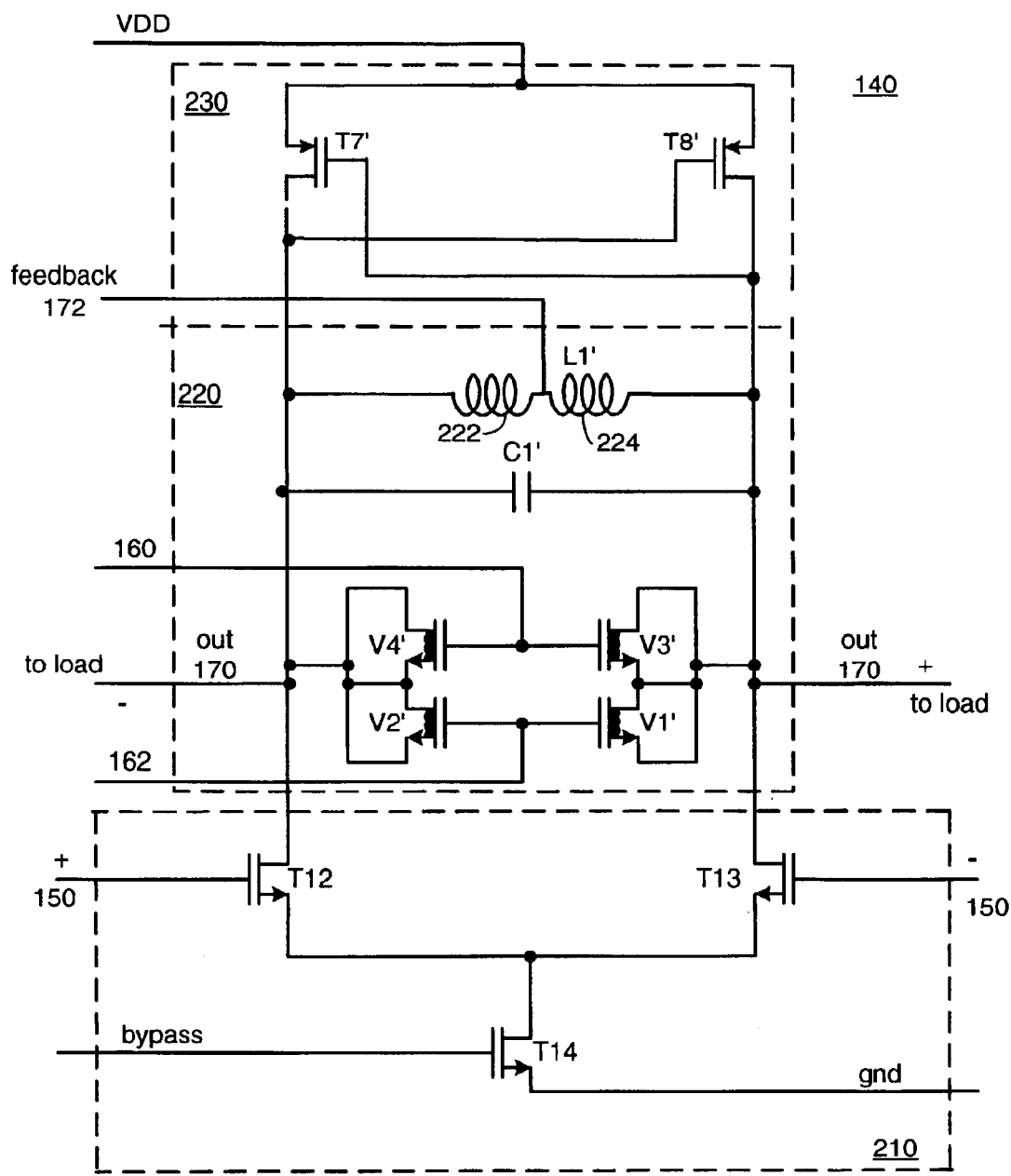
FIG. 3 is a schematic block diagram of a filter amplifier 140 of FIG. 2 in accordance with the present invention.

The present invention can be more fully described with reference to FIGS. 2 through 4. FIG. 2 is a schematic block diagram of an embodiment of a frequency multiplication and amplification circuit 100 in accordance with the present invention. Frequency multiplication and amplification circuit 100 comprises a frequency multiplier circuit 110, a frequency tuned load 120, and a negative feedback circuit 130. The frequency multiplication and amplification circuit 100 can further include a filter amplifier 140 operably coupled to receive and amplify the output of the frequency multiplier circuit 110. FIG. 3 illustrates an embodiment of filter amplifier 140. The embodiment of the present invention shown in FIG. 2 illustrates a differential signal frequency multiplication and amplification circuit 100.

Frequency multiplier circuit 110 is operably coupled to receive a first differential signal 142 (a first sinusoidal waveform) having a first frequency at transistors T1 and T2 and a second differential signal 144 (a second sinusoidal waveform) having a second frequency at transistors T3, T4, T5 and T6. The first differential signal 142 differs from the second differential signal 144 by a fixed phase offset. The fixed phase offset can be arbitrarily set by design of the circuitry providing the first and second differential signals 142 and 144 to the frequency multiplier circuit 110. Frequency multiplier circuit 110 also includes a bias circuit 150 comprising transistors T9, T10 and T11 for biasing transistors T1 and T2. Transistors T9 and T11 comprise a current mirror. Transistor T10 is an optional powerdown transistor. As configured, frequency multiplier circuit 110 is operably coupled to multiply the first differential signal 142 with the second differential signal 144 to produce an output signal comprising a third sinusoidal waveform having a frequency representative of the difference between the first frequency and the second frequency and a fourth sinusoidal waveform having a frequency representative of the sum of the first and second frequencies. The operation of the frequency multiplier circuit 110 as shown in FIG. 2 should be understandable to those familiar with the art.

To multiply the frequency of the first differential signal 142 with the frequency of the second differential signal 144 (i.e., to obtain a frequency multiplication of a pair of same frequency, different phase input signals), the third sinusoidal waveform must be removed. The third sinusoidal waveform is a DC constant term representative of the fixed phase difference between the two input signals (see Equation 4 above). Removing the DC constant term is accomplished by the frequency tuned load 120, which is operably coupled to frequency multiplier 110 to substantially attenuate the third sinusoidal waveform and to substantially pass the fourth sinusoidal waveform as an output of the frequency multiplier 110.

Frequency tuned load 120 includes tunable varactors V1–V4, capacitor C1, and inductor L1 (where L1 represents inductors 122 and 124 in series). Inductor L1 is operably coupled between the positive and negative terminals of frequency multiplier 110 to substantially attenuate the third sinusoidal waveform, the DC constant term. Inductor L1 has a very low resistance and for DC and very low frequencies is effectively a short. The DC gain is therefore very near to zero and the DC constant term is effectively eliminated.

Capacitor C1 is configured across the same positive and negative terminals of the frequency multiplier 110 in parallel with inductor L1. Varactors V1–V4 are similarly connected in parallel with capacitor C1 and inductor L1. Varactors V1–V4 are operably coupled to control the frequency tuned load 120's frequency band of operation. The frequency band of operation is switched via switchable control terminals for varactors V1–V4, which allow the total varactor capacitance to be programmable through register files. Rate select signals 160 and 162 are used to tune varactors V1–V4. Capacitor C1, varactors V1–V4 and other parasitic capacitances form the total capacitance. The total capacitance in parallel with inductor L1 forms a bandpass filter with a center frequency set around the desired output frequency (i.e., the frequency of the fourth sinusoidal waveform).

However, the Q of the resulting frequency multiplier 110 and frequency-tuned load 120 is relatively low. The low Q, coupled with the fact that the output of the frequency multiplier circuit 110 is running at an increased multiple of the input frequency (e.g., two times the input frequency), results in a low amplitude output signal, particularly in a CMOS (Complementary Metal Oxide Semiconductor) implementation. Negative feedback circuit 130 includes PMOS transistors T7 and T8 and feedback signal 151. Feedback signal 151 is from a common mode feedback circuit (not shown) coupled between power supply VDD and inductors 122 and 124. The common mode feedback circuit is the same or similar to that described in FIG. 4 of U.S. patent application Ser. No. 10/043,717 and filed on Jan. 9, 2002, entitled "A Low Jitter Transmitter Architecture with Post-PLL Filter", which is herein incorporated by reference in its entirety. Feedback signal 151 boosts the circuit's Q and the gain of the output signals 150.

The output of frequency multiplier 110 can be further amplified to enable the driving of a large load. Filter amplifier 140, which is illustrated in FIG. 3, is operably coupled to receive and amplify the differential outputs 150 of circuit 100. Filter amplifier 140 can be a negative feedback inductor bandpass filter amplifier as disclosed in U.S. Patent Application entitled "A Low Jitter Transmitter Architecture With Post-PLL Filter" cited above. Frequency multiplier 110, frequency tuned load 120, negative feedback circuit 130 and filter amplifier 140 together form frequency multiplication and amplification circuit 100.

FIG. 3 is a schematic block diagram of a filter amplifier 140 as discussed above with reference to FIG. 2. Filter amplifier 140 comprises input section 210, a frequency tuned load 220, and a negative feedback circuit 230. Input section 210 comprises input transistors T12 and T13, for receiving the differential output signals 150 from circuit 100, and a bypass transistor T14. Negative feedback circuit 230 includes PMOS transistors T7' and T8' and feedback signal 172. Feedback signal 172 is from a common mode feedback circuit similar to that described for FIG. 2 and is coupled between power supply VDD and inductors 122 and 124. The output from filter amplifier 140 is a frequency multiplied and amplitude amplified output signal, i.e., differential signals 170, that can drive a load coupled to frequency multiplication and amplification circuit 100. Frequency multiplication and amplification circuit 100 is thus capable of driving large CMOS loads by providing a frequency multiplied and amplitude amplified output signal. Typical output signal amplitude is greater than 800 mv peak-to-peak.

Figure 4:
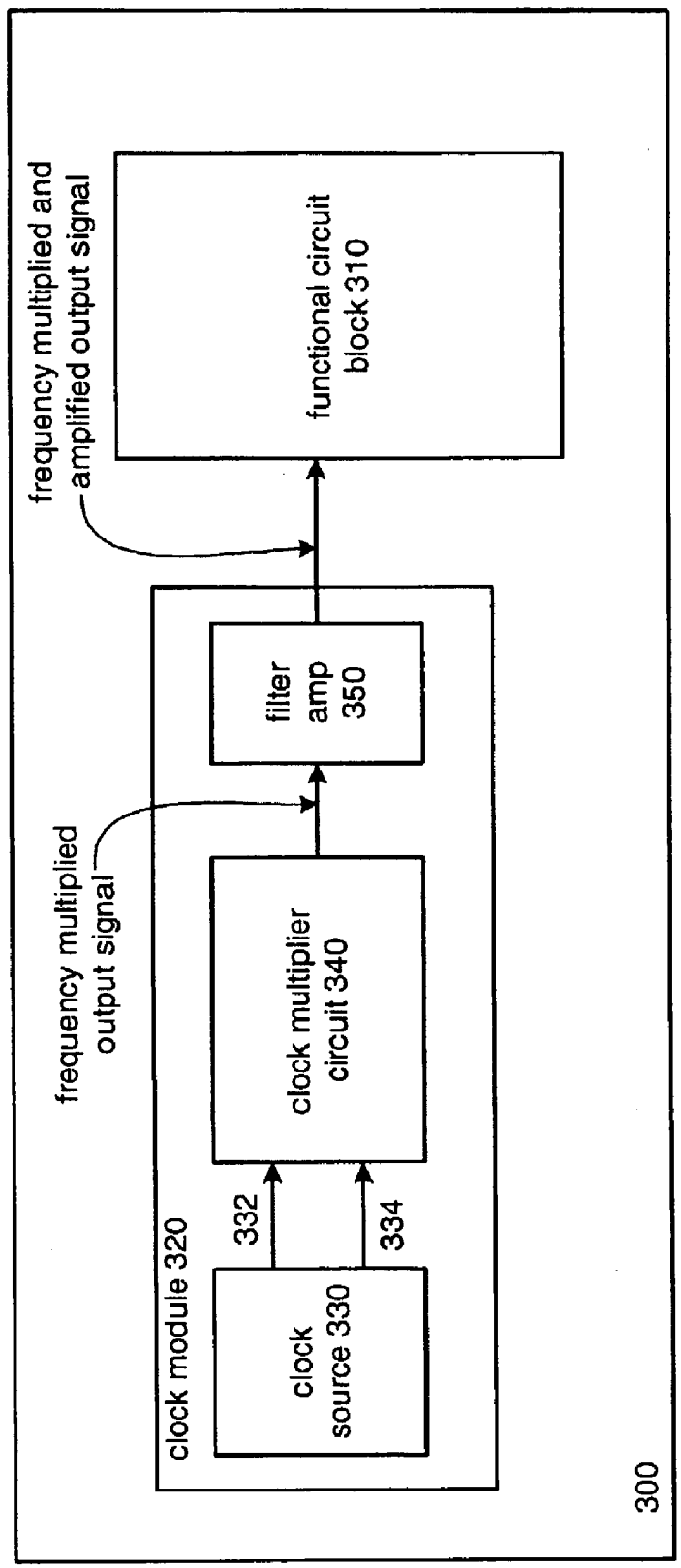
FIG. 4 is a schematic block diagram of an integrated circuit 300 for frequency multiplication in accordance with the present invention.

FIG. 4 is a schematic block diagram of an integrated circuit 300 for frequency multiplication comprising a functional circuit block 310 and a clock module 320. Functional circuit block 310 can be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions and that requires a clock signal. Clock module 320 can further comprise a clock source 330 and a clock multiplier circuit 340.

Clock source 330 is operably coupled to produce a first sinusoidal waveform 332 having a first frequency and a second sinusoidal waveform 334 having a second frequency and a second phase. The second frequency can be equal to the first frequency. Clock source 330 can be a clock driver, or a combination of devices operably coupled to produce the first and second sinusoidal waveforms. For example, clock source 330 can be a single PLL coupled with a clock driver or a combination of two or more PLLs. The clock multiplier circuit 340 can comprise an embodiment of the frequency multiplier circuit of the present invention, such as frequency multiplier and amplification circuit 100 of FIG. 2 Integrated circuit 300 can further include a filter amplifier 350 operably coupled to receive and amplify the output of the clock multiplier circuit 340 in a manner analogous to that discussed with reference to the filter amplifier 140 of FIG. 3.

The embodiments of the frequency multiplication and amplification circuit of the present invention provide a low jitter frequency multiplier without the need for a PLL circuit. Such a frequency multiplier has wide applications in high-speed communications and data storage systems, especially in applications requiring the generation of very high-speed clock signals. The embodiments of this invention provide an integrated circuit with the ability to directly use the differential signal being multiplied to perform frequency multiplication. The present invention further provides the ability to drive a large load with the addition of a switchable bandpass filtering boosting amplifier at the output of the frequency multiplier circuit. The embodiments of the present invention can thus reduce or eliminate the complexity and high cost of prior art frequency multiplication solutions. The various embodiments of the method and apparatus of this invention can be incorporated in a radio or other wireless communication device. As one of average skill in the art will appreciate, other embodiments may be derived from the teaching of the present invention, without deviating from the scope of the claims.

What is claimed is:

1. A frequency multiplier circuit comprising:
    a multiplier operably coupled to multiply a first sinusoidal waveform having a first frequency with a second sinusoidal waveform having the first frequency plus a phase offset to produce a third sinusoidal waveform having a frequency representative of a difference between frequencies of the first and second sinusoidal signals and a fourth sinusoidal waveform having a frequency representative of a sum of the frequencies of the first and second sinusoidal signals, wherein the phase offset is less than ninety degrees; and
    a frequency tuned load operably coupled to substantially attenuate the third sinusoidal waveform and to substantially pass the fourth sinusoidal waveform as an output of the frequency multiplier circuit.

2. The frequency multiplier circuit of claim 1, wherein the frequency multiplier circuit is a single-ended frequency multiplier circuit and wherein the first and the second sinusoidal waveforms are single-ended waveforms.

3. The frequency multiplier circuit of claim 1, wherein the frequency multiplier circuit is a differential frequency multiplier circuit and wherein the first and the second sinusoidal waveforms are differential waveforms.

4. The frequency multiplier circuit of claim 1, wherein the frequency tuned load comprises an inductor operably coupled to substantially attenuate the third sinusoidal waveform.

5. The frequency multiplier circuit of claim 1, wherein the frequency tuned load comprises an inductor and a capacitor, wherein the inductor is operably coupled to substantially attenuate the third sinusoidal waveform and the capacitor is tuned to resonate at a frequency approximately equal to the frequency corresponding to the sum of the first and second frequencies.

6. The frequency multiplier circuit of claim 5, wherein the frequency tuned load is a bandpass filter operably coupled to substantially pass the fourth sinusoidal waveform and to substantially attenuate the third sinusoidal waveform.

7. The frequency multiplier circuit of claim 5, wherein the frequency tuned load further comprises a tunable varactor, wherein the varactor can be tuned to resonate at a frequency approximately equal to the frequency corresponding to the sum of the first and second frequencies.

8. The frequency multiplier circuit of claim 5, further comprising a negative feedback circuit operably coupled to increase the Q of the frequency tuned load.

9. The frequency multiplier circuit of claim 1, further comprising an output driver circuit operably coupled to amplify the output of the frequency multiplier circuit.

10. The frequency multiplier circuit of claim 9, wherein the out put driver circuit comprises a switchable bandpass filter ing amplifier.

11. An integrated circuit comprising:
a functional circuit block; and
a clock module, comprising:
  a clock source operably coupled to produce a first sinusoidal waveform having a first frequency and a second sinusoidal waveform having the first frequency plus a phase offset, wherein the phase offset is less than ninety degrees; and
  a clock multiplier circuit, comprising:
    a multiplier operably coupled to multiply the first sinusoidal waveform with the second sinusoidal waveform to produce a third sinusoidal waveform having a frequency representative of a difference between frequencies of the first and second sinusoidal signals and a fourth sinusoidal waveform having a frequency representative of a sum of the frequencies of the first and second sinusoidal signals; and
    a frequency tuned load operably coupled to substantially attenuate the third sinusoidal waveform and to substantially pass the fourth sinusoidal waveform as an output of the frequency multiplier circuit, wherein the output is provided to the functional circuit block.

12. The integrated circuit of claim 11, wherein the clock multiplier circuit is a single-ended clock multiplier circuit and wherein the first and the second sinusoidal waveforms are single-ended waveforms.

13. The integrated circuit of claim 11, wherein the clock multiplier circuit is a differential clock multiplier circuit and wherein the first and the second sinusoidal waveforms are differential waveforms.

14. The integrated circuit of claim 11, wherein the functional circuit block is a microprocessor.

15. The integrated circuit of claim 11, wherein the frequency tuned load comprises an inductor operably coupled to substantially attenuate the third sinusoidal waveform.

16. The integrated circuit of claim 11, wherein the frequency tuned load comprises an inductor and a capacitor, wherein the inductor is operably coupled to substantially attenuate the third sinusoidal waveform and the capacitor is tuned to resonate at a frequency approximately equal to the frequency corresponding to the sum of the first and second frequencies.

17. The integrated circuit of claim 16, wherein the frequency tuned load further comprises a tunable varactor and wherein the varactor can be tuned to resonate at a frequency approximately equal to the frequency corresponding to the sum of the first and second frequencies.

18. The integrated circuit of claim 16, further comprising a negative feedback circuit operably coupled to increase the Q of the frequency tuned load.

19. The integrated circuit of claim 11, wherein the first and the second frequencies are substantially equal.

20. The integrated circuit of claim 11, wherein the second frequency differs from the first frequency by a fixed phase offset.

21. The integrated circuit of claim 11, further comprising an output driver circuit operably coupled to amplify the output of the frequency multiplier circuit.

22. The integrated circuit of claim 21, wherein the output driver circuit comprises a switchable bandpass filtering amplifier.

23. The integrated circuit of claim 22, wherein the switchable bandpass filtering amplifier is a negative feedback inductor bandpass filter amplifier.

* * * * *